(12) United States Patent
Oe

(10) Patent No.: US 7,010,853 B2
(45) Date of Patent: Mar. 14, 2006

(54) ELECTRIC-COMPONENT MOUNTING SYSTEM

(75) Inventor: Kunio Oe, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 559 days.

(21) Appl. No.: 10/131,251

(22) Filed: Apr. 25, 2002

(65) Prior Publication Data

US 2002/0162676 A1    Nov. 7, 2002

(30) Foreign Application Priority Data

May 7, 2001    (JP) .............................. 2001-136381

(51) Int. Cl.
*H05K 3/30* (2006.01)

(52) U.S. Cl. ........................... 29/740; 29/741; 29/742; 29/744; 29/786; 29/834; 414/737

(58) Field of Classification Search .......... 29/739–743, 29/759–760, 832–834; 198/460.2, 812; 414/737, 414/752
See application file for complete search history.

(56) References Cited

U.S. PATENT DOCUMENTS

| | | | | |
|---|---|---|---|---|
| 3,280,293 A | * | 10/1966 | Webers .......................... | 219/56 |
| 5,329,692 A | * | 7/1994 | Kashiwagi ..................... | 29/740 |
| 5,517,748 A | * | 5/1996 | Park ............................ | 29/741 |
| 5,692,292 A | * | 12/1997 | Asai et al. ..................... | 29/740 |
| 6,378,198 B1 | * | 4/2002 | Asai et al. ..................... | 29/825 |
| 6,688,458 B1 | * | 2/2004 | Prentice et al. ........... | 198/502.2 |

* cited by examiner

*Primary Examiner*—Minh Trinh
(74) *Attorney, Agent, or Firm*—Oliff & Berridge, PLC

(57) ABSTRACT

An electric-component mounting system for mounting a plurality of electric components onto a circuit board. The system includes a plurality of electric-component mounting units which are arranged in a predetermined direction with a spacing distance between each adjacent pair of the electric-component mounting units. Each of the electric-component mounting units includes (a) a board holding device which is capable of holding the circuit board in a predetermined position, (b) a component mounting device which is capable of mounting the electric components onto the circuit board held by the board holding device, and (c) a component supplying device which is capable of supplying the electric components to the component mounting device. The system further includes a spacing-distance changing device capable of changing the spacing distance.

18 Claims, 12 Drawing Sheets

ELECTRIC-COMPONENT MOUNTING SYSTEM

BACKGROUND OF THE INVENTION

1. Field of the Invention

The present invention relates to an electric-component mounting system for assembling an electric circuit board, by placing or mounting a plurality of electric components (including electronic components) onto a circuit board.

2. Discussion of Related Art

There is known an electric-component mounting system for mounting a plurality of electric components onto a circuit board such as a printed board. As one type of the electric-component mounting system, there is known a system including a plurality of electric-component mounting units which are arranged in such a manner that permits a plurality of electric components to be successively mounted, by the arranged electric-component mounting units, onto one (hereinafter referred to as a work surface) of opposite surfaces of the circuit board which is held at the other (hereinafter referred to as a supported surface) of the opposite surfaces. In such an electric-component mounting system, the circuit board is moved in a direction in which the electric-component mounting units are arranged, whereby the circuit board is transferred between the arranged electric-component mounting units, so that each of the electric components is mounted onto the work surface of the circuit board by one of the electric-component mounting units which is assigned to mount the electric component. After the electric components have thus mounted onto the circuit board, the electric components are electrically connected to the circuit board by a solder or other suitable means, whereby an electric circuit board as a product is produced.

In such an electric-component mounting system, if each electric-component mounting unit has a relatively wide working area within which the electric components are mountable onto the circuit board by the same unit, it might be possible to mount the electric components at any position on the entire work surface of the circuit board even where the circuit board has a relatively large size. That is, the wide working area of each electric-component mounting unit provides a high degree of freedom in assigning a role to each electric-component mounting unit, thereby making it possible to increase the efficiency of mounting of the electric components onto the circuit board. However, in general, such an electric-component mounting unit having the wide working area has a large size, and accordingly the electric component mounting system is enlarged as a whole, requiring a large floor space for the installation. This would be problematic where the circuit board has a relatively small size, namely, where the wide working area of each electric-component mounting unit is not fully utilized, resulting in a reduction in the production efficiency per unit space of the floor on which the system is installed.

On the other hand, if each electric-component mounting unit has a relatively narrow working area, it would be possible to work with a small-sized circuit board without a reduction in the production efficiency per unit space of the floor. Further, it would be possible to work with also a large-sized circuit board which has a larger area than the narrow working area of each electric-component mounting unit, for example, by dividing the large area of the circuit board into a plurality of sections so that the electric components are subsequently mounted onto the plurality of sections of the large area by the respective electric-component mounting units. However, there would be a case where the large-sized circuit board is partially superposed on the working area of one of electric-component mounting units while the electric components are being mounted onto the large-sized circuit board by the adjacent electric-component mounting unit. In such a case, the electric-component mounting unit in question is obliged to suspend its mounting operation, resulting in a reduction in the operation efficiency of the electric-component mounting system.

It might be considered possible to activate the electric-component mounting unit in question to mount the electric components onto the part of the large-sized circuit board which is superposed on the working area of the same unit, so that the mounting operations of the respective adjacent units are performed concurrently on the large-sized circuit board. This arrangement might be somewhat effective to avoid the reduction in the operation efficiency of the electric-component mounting system. However, where the superposed part is small, the same unit is obliged to suspend its mounting operation for a while after all. Further, between each adjacent pair of the electric-component mounting units, there commonly exists a non-working area over which the electric components are not mountable onto the circuit board by either one of the adjacent units. The existence of such a non-working area makes it extremely difficult for the electric-component mounting units to efficiently share the area of the circuit board or to share the electric components (to be mounted on the area of the circuit board), resulting in a reduction in the operation efficiency of the electric-component mounting system.

SUMMARY OF THE INVENTION

It is therefore an object of the present invention to avoid a reduction in an efficiency of operation with a relatively large-sized circuit board, in an electric-component mounting system in which each of the electric-component mounting units has a working area that is adapted to be small enough to avoid a reduction in its production efficiency per unit space of the floor.

The above object may be achieved according to any one of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) An electric-component mounting system for mounting a plurality of electric components onto a circuit board, the system comprising: a plurality of electric-component mounting units which are arranged in a predetermined direction with a spacing distance between each adjacent pair of the electric-component mounting units which are adjacent to each other, wherein each of the electric-component mounting units includes (a) a board holding device which is capable of holding the circuit board in a predetermined position, (b) a component mounting device which is capable of mounting the electric components onto the circuit board held by the board holding device, and (c) a component supplying device which is capable of supplying the electric components to the component mounting device, the system further comprising a spacing-distance changing device capable of changing the spacing distance.

In the electric-component mounting system constructed according to this mode (1) of the invention, the spacing interval or distance between each adjacent pair of the electric-component mounting units may be changed in a stepped manner, or alternatively may be changed in a continuous manner. In other words, the spacing distance may be changed such that the spacing distance has a selected one of a plurality of different amounts, or alternatively such that the spacing distance is infinitely variable. Further, the spacing distance may be changed before the installation of the system in a factory or workshop of the user, or after the installation in the workshop of the user. The change of the spacing distance before the installation of the system makes it possible to adapt the system to satisfy the requirements of each individual user, while having to change the design of each electric-component mounting unit of the system. The change of the spacing distance after the installation of the system can be made sometimes or frequently as needed, for example, when the purpose for the use of the system is changed, or when the size of the electric circuit board to be produced by the system is changed. That is, owing to the provision of the spacing-distance changing device in the system, it is possible to prevent a reduction in the operation efficiency of the system, even where the lot of the electric circuit board to be produced by the system is frequently changed.

(2) An electric-component mounting system according to mode (1), wherein each of the electric-component mounting units further includes a main body on which the board holding device, the component mounting device and the component supplying device are disposed, and wherein the spacing-distance changing device includes a spacer which is to be interposed between the main bodies of each adjacent pair of the electric-component mounting units.

In the electric-component mounting system constructed according to this mode (2) of the invention, the spacing distance can be changed such that the spacing distance has a selected one of a plurality of different amounts. If a plurality of sets of spacers having different sizes are prepared, the spacing distance can be changed with a high degree of variety, by interposing a selected one of the spacers between the main bodies of each adjacent pair of the electric-component mounting units. However, the preparation of such plurality of sets of spacers is not essential. That is, it is possible to change the spacing distance by simply selecting an arrangement in which the spacer is interposed between the main bodies of the adjacent pair of the mounting units, or another arrangement in which the spacer is not interposed between the main bodies. Further, it is preferable but not essential that each adjacent pair of the electric-component mounting units are fixed to each other via the spacer. For example, where two mounting units which are located in respective opposite ends of a row or succession of the arranged mounting units are adapted to be unmovable at least in a direction away from each other, the spacer does not have to be fixed to the adjacent pair of the mounting units but may be simply gripped or interposed by and between the main bodies of the adjacent pair of the mounting units.

(3) An electric-component mounting system according to mode (1) or (2), wherein each of the electric-component mounting units further includes a main body on which the board holding device, the component mounting device and the component supplying device are disposed, and wherein the spacing-distance changing device includes a connecting device which connects the main bodies of each adjacent pair of the electric-component mounting units and which is capable of changing the spacing distance such that the spacing distance is infinitely variable.

In the electric-component mounting system of this mode (3) in which the spacing distance between each adjacent pair of the electric-component mounting units can be changed in a continuous manner, it is possible to finely adjust the spacing distance to be most suitable for the size of the circuit board onto which the electric components are to be mounted.

(4) An electric-component mounting system according to any one of modes (1)–(3), wherein each of the electric-component mounting units further includes a main body on which the board holding device, the component mounting device and the component supplying device are disposed, and wherein the spacing-distance changing device includes a connecting device which connects the main bodies of each adjacent pair of the electric-component mounting units and which includes a moving device capable of moving the main bodies of each adjacent pair of the electric-component mounting units toward and away from each other.

The moving device facilitates the change of the spacing distance between each adjacent pair of the mounting units, making it possible to frequently change of the spacing distance as a routine work. The moving device may be equipped with a driving power source, or may be equipped with a manually operable member such as a handle.

(5) An electric-component mounting system according to any one of modes (1)–(4), wherein each of the electric-component mounting units further includes a main body on which the board holding device, the component mounting device and the component supplying device are disposed, and wherein the spacing-distance changing device includes a fixing device which is capable of fixing the main bodies of each adjacent pair of the electric-component mounting units relative to each other, such that the main bodies are unmovable relative to each other after the spacing distance is changed.

The fixing device serves to reliably prevent unintentional change of the spacing distance between each adjacent pair of the mounting units while the electric components are being mounted onto the circuit board, leading to a stable operation of the system.

(6) An electric-component mounting system according to any one of modes (1)–(5), further comprising a board transferring device which is capable of transferring the circuit board between the electric-component mounting units. It should be understood that this board transferring device may be capable of moving or transferring the circuit board, between a downstream end of an upstream side one of each adjacent pair of the mounting units and an upstream end of the other (downstream side) of the adjacent pair of the mounting units, or between a predetermined position within the working area of one of each adjacent pair of the mounting units and the corresponding position within the working are of the other of the adjacent pair of the mounting units, or throughout the succession of the arranged mounting units.

(7) An electric-component mounting system according to mode (6), wherein the board transferring device is provided by the board holding device of each of the electric-component mounting units.

The board transferring device and the board holding device may be constructed independently of each other. However, if the board transferring device is provided by the board holding device as in the system of this mode (7), it is possible to simplify the construction of the system, and also eliminate handling of the circuit board between the board transferring device and the board holding device thereby increasing the efficiency of the mounting operation of the system.

(8) An electric-component mounting system according to mode (6) or (7), wherein the board transferring device includes a conveyor which is capable of transferring the circuit board between each adjacent pair of the electric-component mounting units through a transferring distance in the predetermined direction in which the electric-component mounting units are arranged, and which is capable of changing the transferring distance.

The conveyor facilitates the change of the spacing distance between each adjacent pair of the mounting units without a risk of deterioration in the performance of transferring the circuit board between the mounting units.

(9) An electric-component mounting system according to any one of modes (6)–(8), comprising a second board transferring device in addition to the board transferring device as a first board transferring device, wherein the first board transferring device is capable of transferring the circuit board through a first transferring distance, wherein the second board transferring device is capable of transferring the circuit board through a second transferring distance which is different from the first transferring distance, and wherein the circuit board is transferable between the electric-component mounting units, by a selected one of the first and second board transferring devices.

In the electric-component mounting system of this mode (9) in which the circuit board is transferable between the mounting units through a selected one of the first and second board transferring devices, the selected one may be replaceable with the other of the first and second board transferring devices, for example, each time the spacing distance between each adjacent pair of the mounting units is changed. The system may include, in addition to the first and second board transferring devices, more board transferring devices providing different transferring distances, in view of a large variation of the spacing distance. It should be noted that each of the first and second transferring devices may be provided in each of the plurality of mounting units, or alternatively may be provided in the entirety of the system. In the latter case, the transferring device bridges over the entirety of the row of the mounting units.

(10) An electric-component mounting system according to any one of modes (6)–(9), wherein the board transferring device includes a conveyor which is capable of transferring the circuit board between each adjacent pair of the electric-component mounting units in the predetermined direction in which the electric-component mounting units are arranged, and wherein the conveyor includes a pair of belts which are spaced apart from each other in a direction perpendicular to the predetermined direction, so that the circuit board is transferred while being supported, at portions of a surface thereof which are distant from each other, by the pair of belts.

(11) An electric-component mounting system according to any one of modes (6)–(10), wherein the component supplying device of each of the electric-component mounting units is disposed on at least one of opposite sides of the board transferring device in a direction perpendicular to the predetermined direction as seen in a plan view of the system, and wherein the component supplying device includes a plurality of component supplying portions through which the component supplying device is capable of supplying respective different sorts of components as the electric components, to the component mounting device.

(12) An electric-component mounting system according to any one of modes (1)–(11), wherein each of the plurality of electric-component mounting units includes at least three wheels each rotatable about an axis thereof which is perpendicular to the predetermined direction in which the electric-component mounting units are arranged.

The provision of the wheels in each of the mounting units facilitates the movement of each mounting unit in the predetermined direction in which the mounting units are arranged, thereby making it possible to easily change the spacing distance between each adjacent pair of the mounting units. Therefore, this arrangement is effective, particularly, where the change of the spacing interval is made very frequently as a routine work, or where the number of the mounting units constituting the system is very large.

(13) An electric-component mounting system according to any one of modes (1)–(12), wherein the component supplying device of each of the electric-component mounting units includes a plurality of component supplying portions through which the component supplying device is capable of supplying respective different sorts of components as the electric components, to the component mounting device, and wherein the plurality of component supplying portions are arranged in the predetermined direction in which the electric-component mounting units are arranged.

The component supplying device may be provided by a plurality of tape feeders which are arranged in the above-described predetermined direction, wherein each tape feeder is adapted to successively feed a tape which holds the electric components arranged at a predetermined pitch in a longitudinal direction of the tape, for thereby supplying the electric components one by one to the component mounting device. Alternatively, the component supplying device may be provided by a plurality of bulk feeders which are arranged in the above-described predetermined direction, wherein each bulk feeder is adapted to accommodate therein the electric components loaded in bulk, and to line up the components for supplying the components one by one to the component mounting device.

(14) An electric-component mounting system according to any one of modes (1)–(13), wherein the component mounting device of each of the electric-component units includes: a mounting head which is capable of mounting the electric components at respective positions on the circuit board held by the board holding device; and a mounting-head moving device which is capable of moving the mounting head relative to the board holding device in at least one of the predetermined direction and a direction perpendicular to the predetermined direction.

In the electric-component mounting system of this mode (14) in which the mounting head is movable relative to the board holding device by the mounting-head moving device, the electric components can be mounted at respective desired positions on the work surface of the circuit board, without having to move the board holding device and the component supplying device. Since this arrangement permits each of the mounting units to be made compact in size, the system of this mode (14) can more effectively enjoy the technical advantages provided by the present invention.

(15) A spacing-distance changing device for changing a spacing distance between each adjacent pair of a plurality of electric-component mounting units of an electric-component mounting system which are arranged in a predetermined direction, each of the electric-component mounting units including: (a) a board holding device which is capable of holding a circuit board in a predetermined position; (b) a component mounting device which is capable of mounting electric components onto the circuit board held by the board holding device, (c) a component supplying device which is capable of supplying the electric components to the component mounting device; and (d) a main body on which the board holding device, the component mounting device and the component supplying device are disposed, the spacing-distance changing device comprising a moving device capable of moving the main bodies of each adjacent pair of the electric-component mounting units toward and away from each other.

(16) A spacing-distance changing device according to mode (15), further comprising a conveyor which is capable of transferring the circuit board between each adjacent pair of the electric-component mounting units through a transferring distance in the predetermined direction in which the electric-component mounting units are arranged, and which is capable of changing the transferring distance in synchronization with movements of the main bodies which are made by the moving device.

(17) A spacing-distance changing device according to mode (15) or (16), wherein the moving device includes: a shaft member rotatable about an axis thereof that extends in the predetermined direction, and having a left-hand threaded portion and a right-hand threaded portion in respective axially opposite end portions thereof; a first internally threaded member engaged with the left-hand threaded portion; and a second internally threaded member engaged with the right-hand threaded portion, and wherein the first and second internally threaded members are fixed to the respective main bodies of each adjacent pair of the electric-component mounting units, whereby the main bodies are movable toward and away from each other in response to rotation of the rotatable shaft member.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 4:
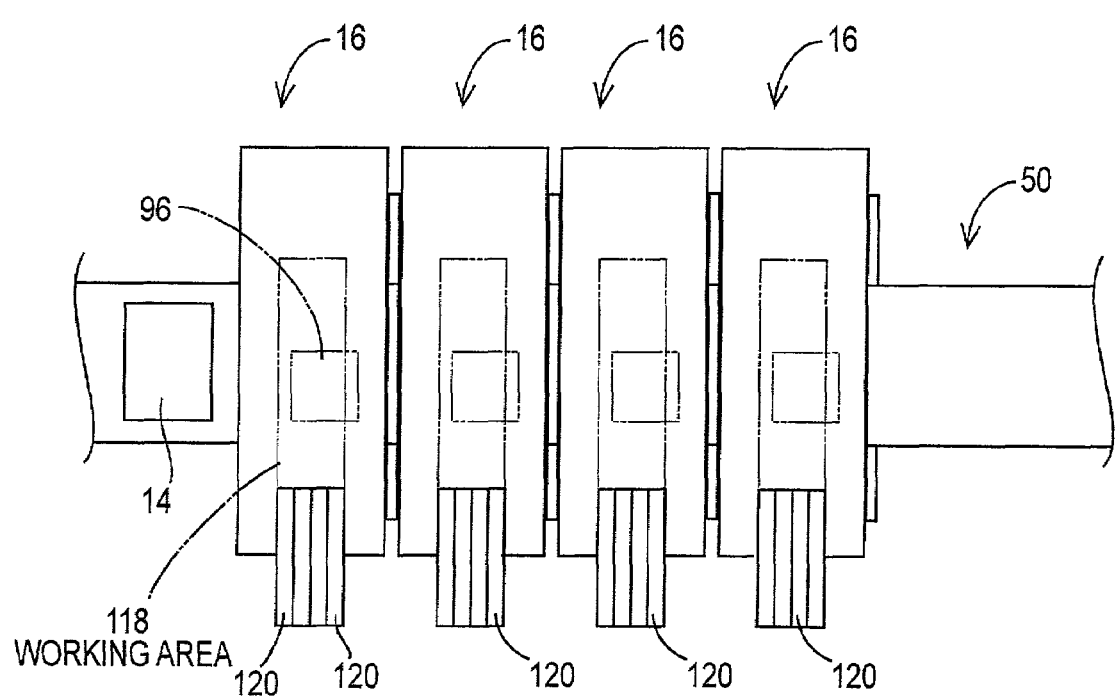
FIG. 4 is an upper plan view showing connection between the electric-component mounting units of the system.
Figure 5:
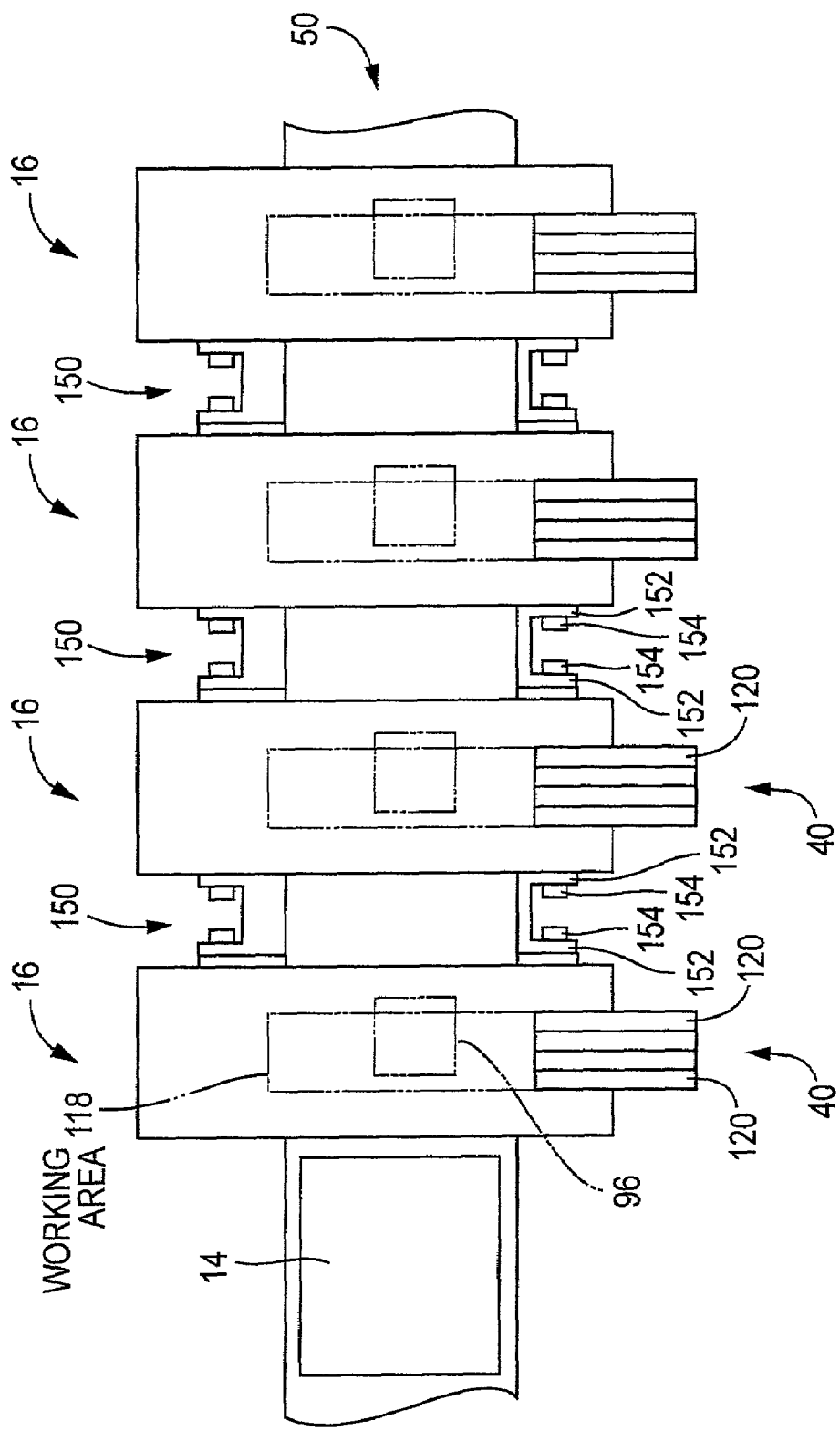
FIG. 5 is an upper plan view showing connection between the electric-component mounting units through spacers.

There will be described an electric-component mounting system which is constructed according to one embodiment of the present invention. The mounting system includes a plurality of electric-component mounting units 16 each capable of mounting electric components 12 onto circuit boards in the form of printed circuit boards (PC boards) 14. The plurality of mounting units 16 are arranged in a straight line, as shown in FIGS. 4 and 5. Hereinafter, a direction parallel to this straight line is referred to as the "X-axis direction". In this mounting system, the plurality of mounting units 16 are activated concurrently with each other, whereby the electric components are placed or mounted onto the PC boards 14 with a high efficiency. It is noted that the term "electric component" should be interpreted to mean an electronic component, connector or other electric component.

Figure 1:
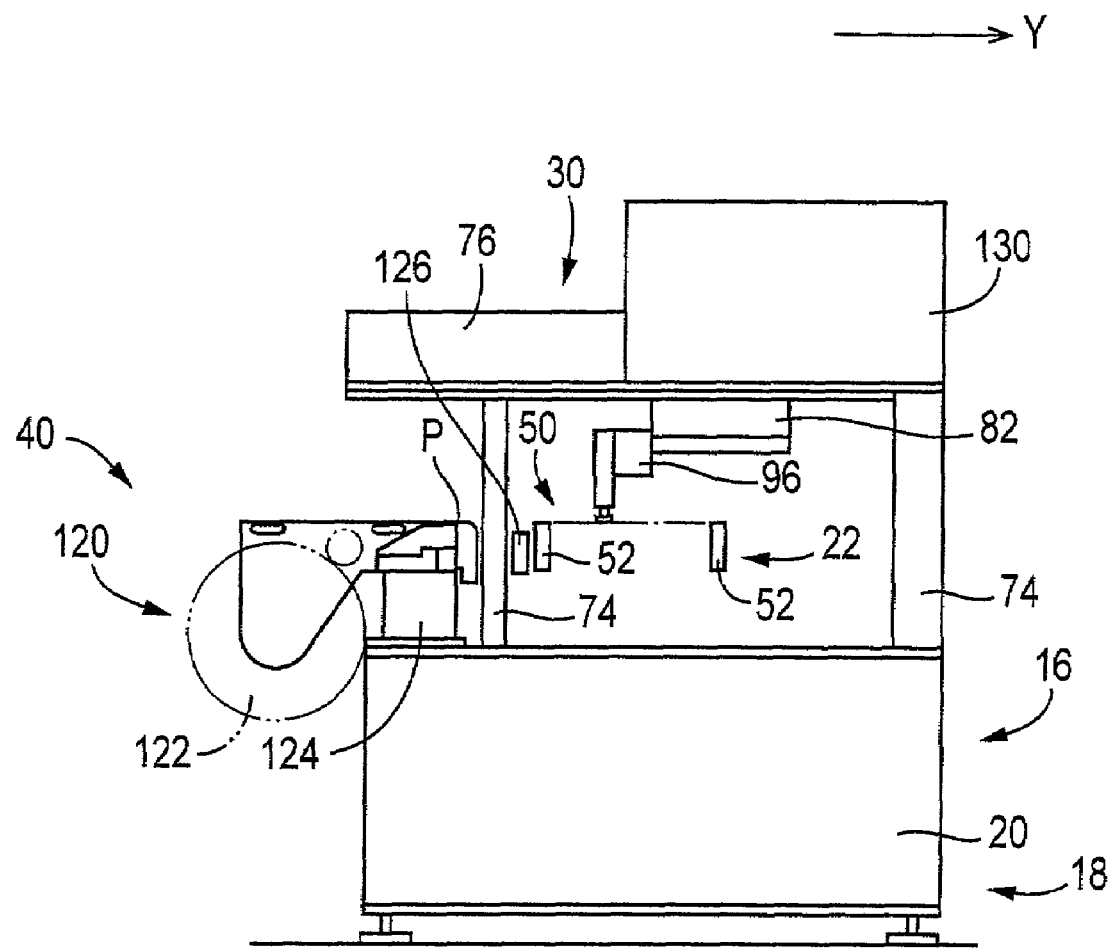
FIG. 1 is a view of one of electric-component mounting units of an electric-component mounting system constructed according to one embodiment of the invention, as seen in an arrangement direction in which the mounting units are arranged.
Figure 2:
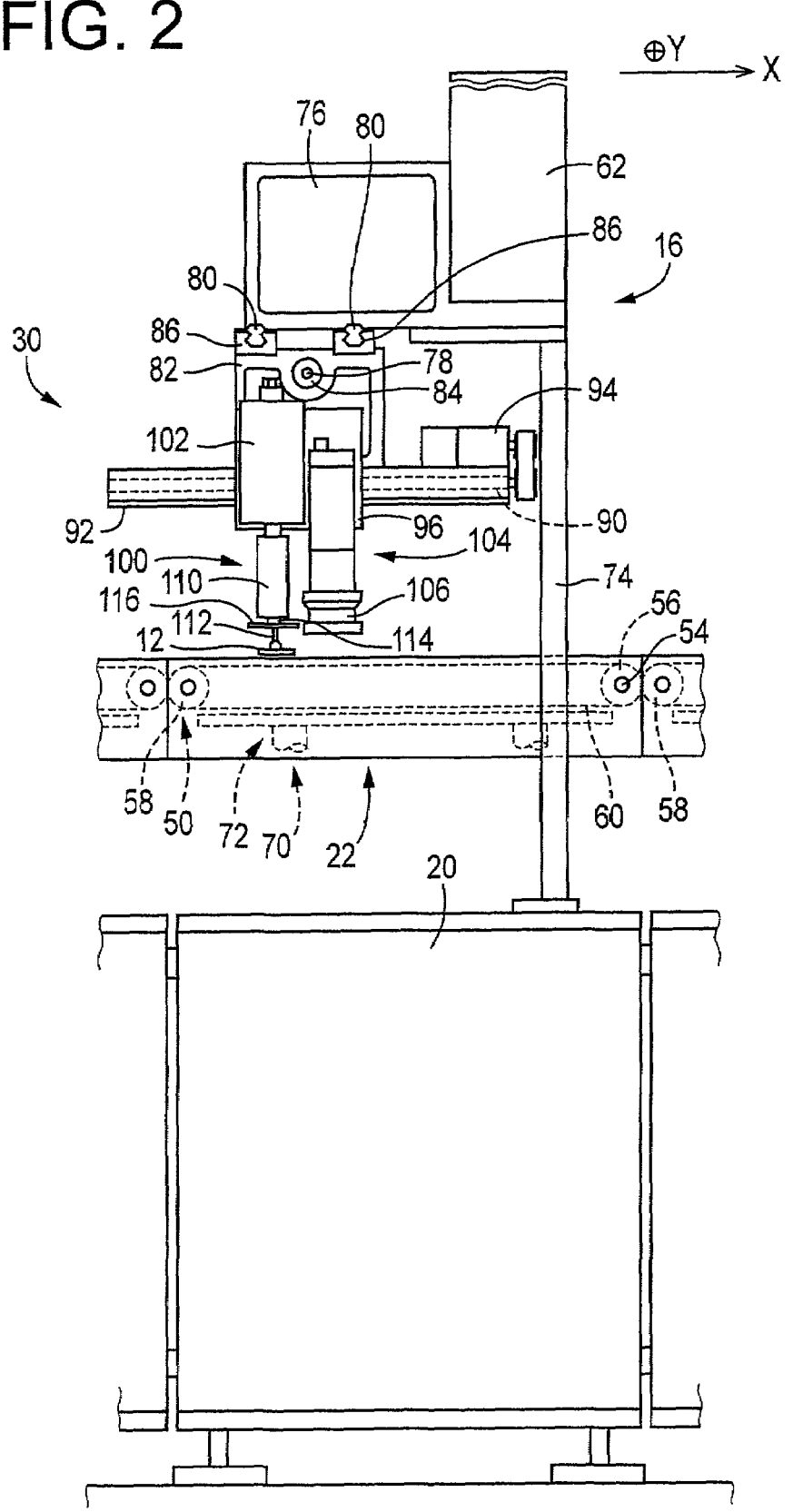
FIG. 2 is a view of the electric-component mounting unit of FIG. 1, as seen in a direction perpendicular to the above-described arrangement direction.

FIGS. 1 and 2 show the construction of each of the mounting units 16. Each mounting unit 16 includes a main body 18 which is principally constituted by a bed 20. The main body 18 supports a board transferring and holding device 22 which serves to transfer and hold the PC board 14 in a predetermined position. On the bed 20, there is disposed a component mounting device 30 and a component supplying device 40 as well as the board transferring and holding device 22. The component supplying device 40 serves to supply the electric components 12 to the component mounting device 30. The component mounting device 30 serves to receive the electric components 12 from the component supplying device 40, and then mount the electric components 12 onto a work surface of the PC board 14.

The board transferring and holding device 22 is equipped with a board conveyor 50. The board conveyor 50 includes a pair of side frames 52 which extends in the X-axis direction in which the PC board 14 is transferred between the mounting units 16. A shaft 54 is attached at its axially opposite end portions to respective end portions of the side frames 52 (respective forward end portions of the side frames 52 as viewed in a transferring direction in which the PC board 14 is transferred by the board transferring and holding device 22). The shaft 54 is rotatable about its axis extending in a Y-axis direction which is parallel with a horizontal plane and is perpendicular to the X-axis direction. Driving pulleys 56 are fixed to the respective axially opposite end portions of the shaft 54.

Driven pulleys 58 are attached to respective rear end portions of the side frames 52, such that each of the driven pulleys 58 is rotatable about its axis extending in the Y-axis direction. Two endless conveyor belts 60 are wound on the respective pairs of driving and driven pulleys 56, 58. The shaft 54 is rotated by a transfer motor 62 (shown in FIG. 3), whereby the driving pulleys 56 are rotated together with the shaft 54. With the rotations of the driving pulleys 56, the conveyor belts 60 are circulated, whereby the PC board 14 is moved in the transferring direction while being guided by inside surfaces (mutually opposed surfaces) of the respective side frames 52. It is noted that a transferring distance, through which the PC board 14 is moved by the board conveyor 50, is adapted to be slightly smaller than a width of the mounting unit 16, i.e., a dimension of the mounting unit 16 as measured in the transferring direction.

A board supporting device 70 is provided below the board conveyor 50 which is constructed as described above. The board supporting device 70 includes a lifter 72 which has a width slightly smaller than that of the mounting unit 16 and which is vertically movable by an elevating device. The PC board 14 is sucked and supported at its supported surface (the surface opposite to the above-described work surface) by the lifter 72 with application of a vacuum pressure to the supported surface.

Two struts 74 are provided to extend upwardly from the bed 20 of the main body 18, such that the struts 74 are spaced apart from each other as viewed in the Y-axis direction. A beam 76 is fixed to upper end portions of the respective struts 74, and extends in the Y-axis direction. Below the beam 76, a ball screw 78 as a feed screw and a pair of guide rails 80 are provided to extend in the Y-axis direction. A Y-axis slide 82 is engaged with the ball screw 78 through a nut 84 which is fixed to the Y-axis slide 82, and is guided by the guide rails 80 through respective guide blocks 86 which are also fixed to the Y-axis slide 82, so that the Y-axis slide 82 is moved in the Y-axis direction as the ball screw 78 is rotated by a Y-axis motor 88 (shown in FIG. 3).

Under the Y-axis slide 82, a ball screw 90 as a feed screw and a pair of guide rails 92 are provided to extend in the X-axis direction. Like the Y-axis slide 82, an X-axis slide 96 is moved in the X-axis direction as the ball screw 90 is rotated by an X-axis motor 94 (shown in FIG. 3), while being guided by the guide rails 92.

On the X-axis slide 96, there are mounted a mounting head 100, an elevating and rotating device 102 and a reference-mark taking device 104. The elevating and rotating device 102, having a Z-axis motor 107 and a θ-axis motor 108 (shown in FIG. 3), serves to upwardly and downwardly move the mounting head 100 in a Z-axis direction that is perpendicular to the X-axis and Y-axis directions, and to rotate the mounting head 100 about a vertical axis which extends in the Z-axis direction. The reference-mark taking device 104, having a CCD camera 106, is moved together with the movements of the Y-axis slide 82 and the X-axis slide 96 so as to be positioned in a desired position. The reference-mark taking device 104, which is thus positioned in the desired position, activates the CCD camera to take an image of each fiduciary or reference mark provided in the PC board 14.

The mounting head 100 is equipped with a main body 110, by which a suction nozzle 112 is held through a nozzle holding member 114 such that the suction nozzle 112 is vertically movable relative to the main body 110. An illuminating plate 116 is provided between the suction nozzle 112 and nozzle holding member 114. The illuminating plate 116 absorbs an ultraviolet which is generated by an ultraviolet generating device (not shown) and then irradiates a visible light. In an operation of the mounting unit 16, the mounting head 100 sucks the electric component 12 with application of a vacuum pressure to the electric component 12 through the suction nozzle 112, and is then moved by the movements of the respective X-axis and Y-axis slides 96, 82 so as to be positioned in a desired position on a horizontal plane while being vertically moved and rotated by the elevating and rotating device 102. The mounting head 100 is movable in the X-axis and Y-axis directions within an area 118 defined by the two-dot chain line in FIGS. 4 and 5. This area 118 corresponds to a working area, within which the electric components 12 are mountable onto the PC board 14 by the mounting head 100. In an example illustrated by each of FIGS. 4 and 5, the working area 118 has a width which is about a half of the width of the mounting units 16, and is located in an intermediate portion of the mounting unit 16 as viewed in the X-axis direction.

As shown in FIGS. 4 and 5, the component supplying device 40 is located on one of opposite sides of the board conveyor 50 as viewed in the Y-axis direction. The component supplying device 40 has a plurality of feeders 120 which are fixed to a supporting base 124 disposed on the bed 20. When the electric components 12 are supplied to the component mounting device 30 from each of the feeders 120, the electric components 12 are held by a component carrier tape which is provided in each of the feeders 120. The component carrier tape has a multiplicity of component accommodating recesses which are open in one of opposite surfaces of the tape and which are spaced apart from each other in a longitudinal direction of the tape at a constant spacing interval. The recesses accommodate the respective electric components 12, and are closed by a covering tape for preventing the electric components 12 from being removed from the recesses. A roll of the component carrier tape is wound on a reel 122 (shown in FIG. 1), and is intermittently fed by a suitable feed device (not shown) from the reel 122 at a pitch corresponding to the spacing interval of the component accommodating recesses of the tape. As the component carrier tape is fed, the covering tape is removed to permit the electric components 12 to be removed from the recesses, so that the electric components 12 are successively fed one after another to a component supplying portion P in which the electric components 12 are supplied to the component mounting device 30. It is noted that the plurality of feeders 120 are positioned relative to the main body 18 such that the component supplying portions of the respective feeders 120 are arranged in a straight line extending in the X-axis direction.

Between the component supplying device 40 and the board conveyor 50, there is provided a component-image taking device 126 which serves to take an image of the electric component 12 held by the suction nozzle 112, as shown in FIG. 1.

Figure 3:
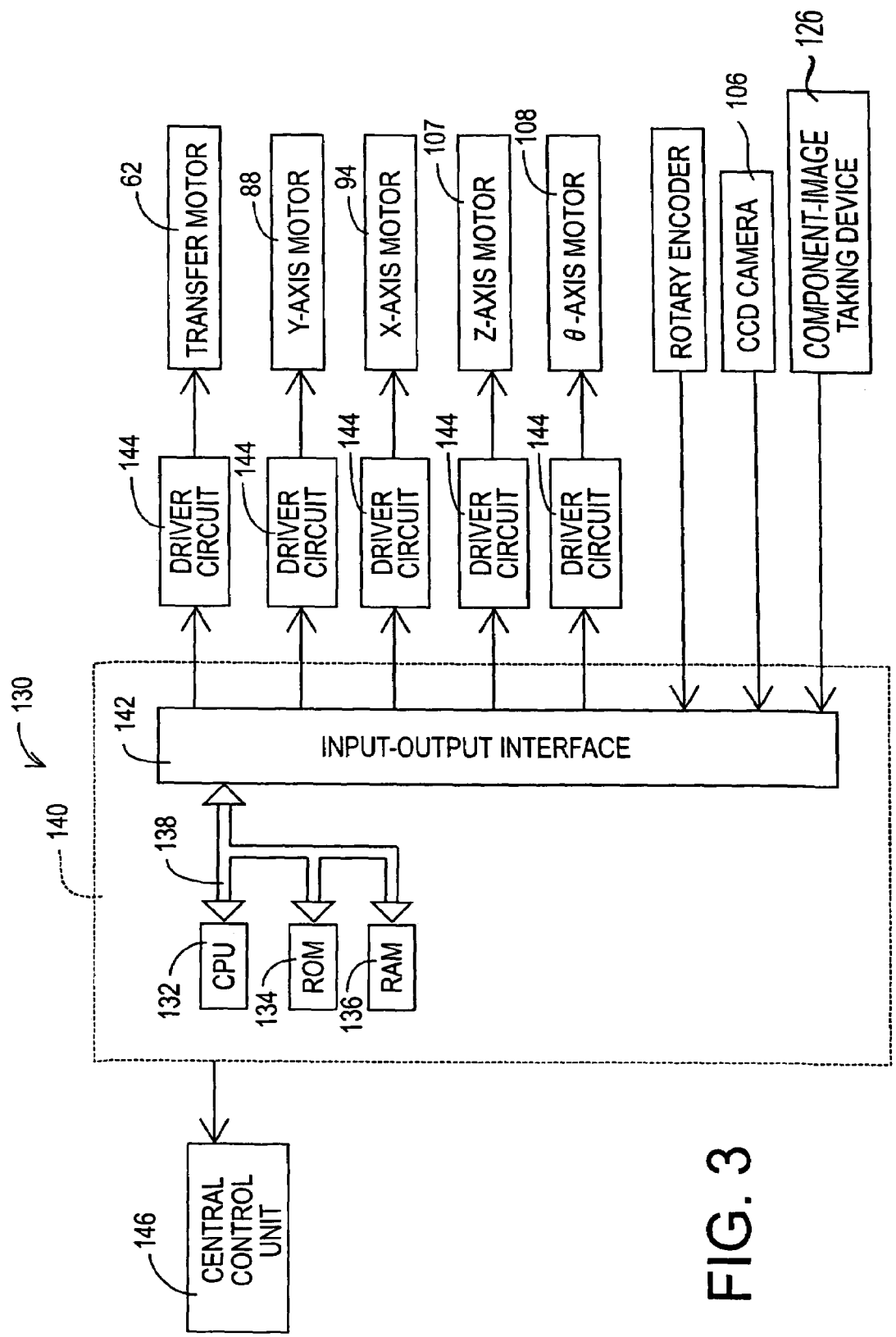
FIG. 3 is a block diagram showing a control device of the electric-component mounting system.

Each electric-component mounting unit 16 of the system has a local control device 130. This local control device 130 is principally constituted by a computer 140 which incorporates a central processing unit (CPU) 132, a read-only memory (ROM) 134, a random-access memory (RAM) 136, and a bus 138 interconnecting those elements, as shown in FIG. 3. To the bus 138, there is connected an input-output interface 142 to which are connected the CCD camera 106, component-image taking device 126 and rotary encoders each of which serves to detect an angle of rotation of an output shaft of the corresponding one of the above-described transfer motor 62, X-axis motor 94, Y-axis motor 88, Z-axis motor 107 and θ-axis motor 108.

To the input-output interface 142, there are also connected the above-described motors 62, 94, 88, 107, 108 via respective driver circuits 144. The ROM 134 stores various control programs including programs necessary for placing the electric components 12 onto the PC board 14.

All the local control devices 130 of the respective electric-component mounting units 16 are connected to a central control device 146, as shown in FIG. 3, so that the local control devices 130 are provided by the central control device 146 with data, each of which varies depending upon the kind of the PC board 14, such as data representative of positions in which the electric components 12 are to be received or mounted. The operations made by the mounting units 16 for mounting the electric components 12 onto the PC boards 14 are controlled by the respective local control devices 130 independently of each other.

The electric-component mounting system is provided by a succession of the plurality of the electric-component mounting units 16 each of which is constructed as described above. In the system shown in FIG. 5, the four mounting units 16 are connected to each other through spacers 150 which are interposed between the mounting units 16. Each pair of the mounting units 16 adjacent to each other are firmly fixed relative to each other through the spacers 150. In an upstream end of the succession of the mounting units 16 as viewed in the above-described transferring direction, there is provided a screen printing device (not shown) for printing a creamed solder onto the PC boards 14, or an adhesive applying device (not shown) for applying an adhesive onto the PC boards 14. In a downstream end of the succession of the mounting units 16, there is provided a reflowing oven for melting the creamed solder, or curing oven for hardening or curing the adhesive.

Each of the spacers 150 is provided by a substantially prismatic member, and has two flange portions 152 in its respective opposite end portions as viewed in the X-axis direction. Each of the flange portions 152 extends from the corresponding end portion in a direction perpendicular to the X-axis direction. Each flange portion 152 has at least one through-hole extending therethrough in its thickness direction, i.e., in the X-axis direction. A bolt 154 is introduced into the through-hole formed in each flange portion 152 of the spacer 150, and is screwed into an internally threaded hole formed in a corresponding portion of the bed 20, whereby the spacer 150 is fixed to the component mounting units 16 which are adjacent to the spacer 150. It is possible to prepare a plurality of sets of spacers 150 which have different sizes and which are replaceable with each other, for thereby varying the spacing distance between each adjacent pair of the mounting units 16 which are to be fixed relative to each other through the spacers 150. In this instance, a suitable set of spacers 150 is selected from among the prepared sets in view of the size of the PC board 14, and the selected spacers 150 are interposed between the mounting units 16, whereby the mounting units 16 are fixed relative to each other through the spacers 150, with the spacing distance having an amount suitable for the size of the PC board 14. It is noted that the mounting units 16 do not have to fixed relative to each other necessarily through the spacers 150, but may be held in contact with each other so as to be fixed directly to each other without interposing the spacers 150 between the mounting units 16, as shown in FIG. 4.

Figure 6A:
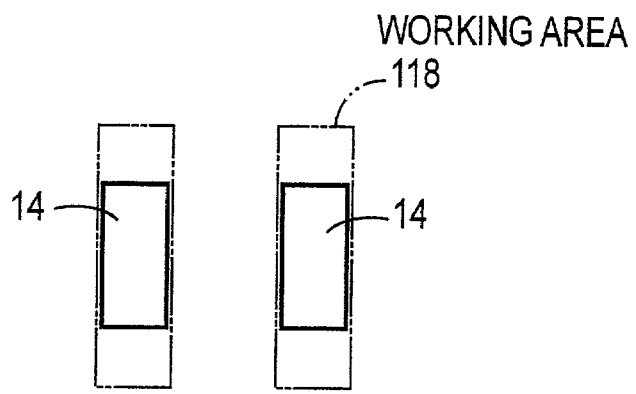
FIGS. 6A–6D are views for explaining a relationship among the size of the circuit board, the size of the working area of each mounting unit and the spacing interval between the mounting units.
Figure 6B:
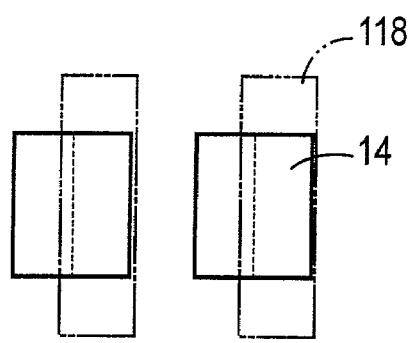

There will be next described an operation of the present electric-component mounting system. Firstly, the PC board 14 on each of which the electric components 12 are to be mounted is loaded onto the first mounting units 16, which is located in the upstream end of the succession of the mounting units 16, i.e., which is the closest to the screen printing device or the adhesive applying device. All the board conveyors 50 of the respective mounting units 16 are then activated, whereby the PC board 14 is moved together with the other PC boards 14 which have been loaded onto the mounting system earlier than that PC board 14. The PC board 14 is stopped to be positioned in a predetermined position relative to the working area 118 of the first mounting unit 16, and is held in the predetermined position. In this instance, if the dimension of the PC board 14 as measured in the transferring direction is smaller than that of the working area 118 (defined by the two-dot chain line), as shown in FIG. 6A, the PC board 14 is positioned in such a position that permits the entirety of the PC board 14 to lie within the working area 118. If the dimension of the PC board 14 is larger than that of the working area 118, as shown in FIG. 6B, the PC board 14 is positioned in such a position that permits at least a front portion of the PC board 14 (as viewed in the transferring direction) to lie within the working area 118.

There will first be described an operation of the present electric-component mounting system where the dimension of the PC board 14 as measured in the transferring direction is smaller than that of the working area 118. It is noted that the following description refers to only the operation where the mounting units 16 of the system are fixed directly to each other without provision of the spacers 150 therebetween, in the interest of simplification of the explanation.

While the PC board 14 is held in the predetermined position, the lifter 72 of the board transferring and holding device 22 is moved up, operated to hold the PC board 14 by vacuum suction, and is further moved up to lift the PC board 14 above the board conveyor 50. Then, the reference-mark taking device 104 is moved to a position right above each of the reference marks provided on the PC board 14, and is activated to obtain image data of the reference marks. The image data are sent to the local control device 130, so that the control device 130 calculates amounts of the positioning errors of the PC board 14 in the horizontal plane, on the basis of the image data. Namely, the distance between the desired position and the actual position of the PC board 14 as measured in each of the X-axis and Y-axis direction, and also the amount of actual inclination of the PC board with respect to a desired direction are obtained on the basis of the image data.

After the image data of the reference marks have been obtained by the reference-mark taking device 104, the mounting head 100 is moved to a component receiving position (right above the component supplying position P), and then picks up the electric component 12 from one of the plurality of feeders 120. The mounting head 100 is moved up, and is then moved to a component mounting position via a component-image taking position, so as to mount the electric component 12 onto the PC board 14.

Figure 6C:
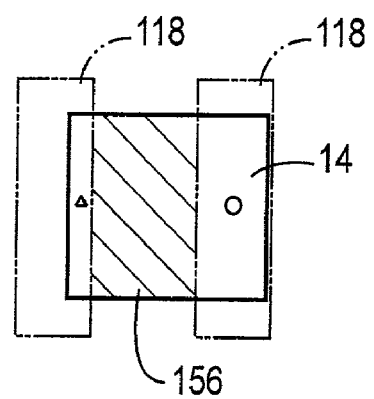

When the operation of the first mounting unit 16 to place all the designated components 12 on the PC board 14 is completed, the local control device 130 informs the central control device 146 of this fact. When the central control device 146 has been informed that an operation of the second mounting unit 16 (which is located on the downstream side of the first mounting unit 16) is also completed, the central control device 146 commands the board conveyors 50 of the first and second mounting units 16 to be activate to transfer the PC board 14 to the second mounting unit 16, so that other electric components 12 are mounted onto the PC board 14 in the second mounting unit 16.

Where the dimension of the PC board 14 as measured in the transferring direction is larger than that of the working area 118 but is smaller than that of each mounting unit 16, as shown in FIG. 6B, the process of mounting the electric components 12 onto the PC board 14 is divided into two steps. That is, in the first step, some of the electric components 12 are mounted onto the PC board 14 while the front portion of the PC board 14 is positioned to lie within the working area 118 of the mounting unit 16. In the second step, the other electric components 12 are mounted onto the PC board 14 while the rear portion of the PC board 14 is positioned to lie within the working area 118 of the mounting unit 16.

Where the dimension of the PC board 14 as measured in the transferring direction is larger than that of the working area 118 and is also larger than that of each mounting unit 16, the process of mounting the electric components 12 onto the PC board 14 is divided into two or more steps. There would be a case, as shown in FIG. 6C, where the PC board 14 is partially superposed on the working area 118 of the adjacent mounting unit 16 while the electric components 12 are being mounted onto the PC board 14 by the component unit 16 in question. In such a case, the adjacent mounting unit 16 is obliged to suspend its mounting operation, resulting in a reduction in the operation efficiency of the electric-component mounting system. It might be considered possible to activate the adjacent mounting unit 16 to mount the electric components 12 onto the part (indicated by the mark "Δ" in FIG. 6C) of the PC board 14 which is superposed on the working area of the adjacent mounting unit 16, so that the mounting operations of the two adjacent mounting units are performed concurrently on the PC board 14. This arrangement might be somewhat effective to avoid the reduction in the operation efficiency of the electric-component mounting system. However, where the superposed part is small, the adjacent mounting unit 16 is obliged to suspend its mounting operation for a while after all. Further, between each adjacent pair of the mounting units 16, there commonly exists a non-working area 156 (indicated by hatching in FIG. 6C) over which the electric components 12 are not mountable onto the PC board 14 by either one of the adjacent mounting units 16. The existence of the non-working area 156 makes it extremely difficult for the mounting units 16 to efficiently share the area of the PC board 14 or to share the electric components 12 (to be mounted on the area of the PC board 14), resulting in a reduction in the operation efficiency of the electric-component mounting system.

Figure 6D:
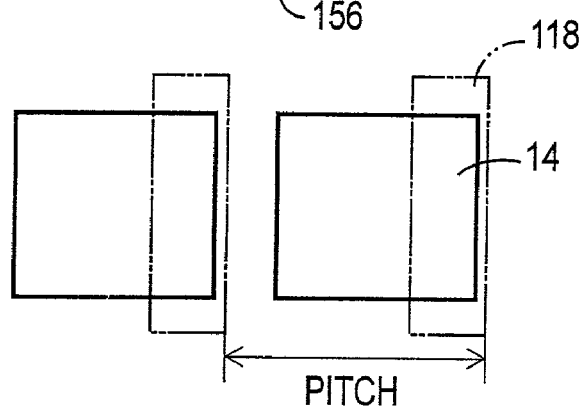

In view of the above-described problem, the present electric-component mounting system is constructed such that the working areas 118 of the respective mounting units 16 are arranged at a pitch which is always larger than the dimension of the PC board 14 as measured in the transferring direction, as shown in FIG. 5, by interposing, between each adjacent pair of the mounting units 16, the spacer 150 which is selected from among the plurality of prepared spacers 150 having respective different sizes. Thus, the provision of the spacer 150 having a suitable size between each adjacent pair of the mounting units 16 makes it possible to adapt the system to satisfy the requirements of each individual user. It is to be understood from the foregoing description of the present embodiment that the spacer 150 serves as a spacing-distance changing device for changing the spacing distance between each adjacent pair of the mounting units 16, and also serves as a fixing device for fixing each adjacent pair of the mounting units 16 relative to each other. Further, the above-described term "pitch" should be interpreted to as a distance between a point of one of the adjacent working areas 118 and the corresponding point of the other of the adjacent working areas 118, for example, the distance between downstream ends of the respective working areas 118 as measured in the transferring direction, as indicated in FIG. 6D.

Further, in the electric-component mounting system in which the board conveyor 50 is provided in each of the mounting unit 16, a plurality of board conveyors 50 having different sizes are prepared so that a suitable one of the plurality of board conveyors 50 is selected depending upon the size of spacer 150 interposed between each adjacent pair of the mounting units 16. That is, the board conveyor 50 provided in each mounting unit 16 is adapted to be replaceable with the other board conveyor 50 each time the spacing distance between each adjacent pair of the mounting units 16 is changed. It is noted that the board transferring and holding device 22 may be adapted to bridge over the entirety of the row of the mounting units 16, so as to serve commonly for all the mounting units 16 of the system. In this case, the entirety of the board transferring and holding device 22 is preferably changeable with another each time the spacing distance is changed.

Further, the spacing distance can be changed even after the installation of the system in a factory or workshop of the user. Namely, the change of the spacing distance can be frequently as needed in the workshop, for example, when the purpose for the use of the system is changed. Still further, the preparation of the plurality of kinds of spacers 150 is not essential. That is, it is possible to change the spacing distance by simply selecting an arrangement in which the spacer 150 is interposed between each adjacent pair of the mounting units 16, or another arrangement in which the spacer 150 is not interposed between the mounting units 16.

While each adjacent pair of the mounting units 16 are firmly fixed to each other via the spacer 150 in the present embodiment, the spacer 150 does not necessarily have to be fixed to the adjacent pair of mounting units 16 but may be simply gripped or interposed by and between the adjacent pair of mounting units 16, for example, where two mounting units 16 located in respective opposite ends of the row of the mounting units 16 are adapted to be unmovable at least in a direction away from each other.

As is apparent from the foregoing description, the present electric-component mounting system is capable of working with a relatively small-sized PC board without a reduction in its operation efficiency per unit space of the installation floor, and also is capable of efficiently working with a relatively large-sized PC-board.

In the present embodiment, the spacing distance between each adjacent pair of the electric-component mounting units 16 is adjusted or changed in a stepped manner, by disposing the spacers 150 having the suitable sizes between the mounting units 16, so that the electric-component mounting system is constructed to be suitable for the size of the PC board 14. However, it is also possible to adjust or change the spacing distance by using device or member other than the spacer 150 as in the embodiments described below.

Figure 7:
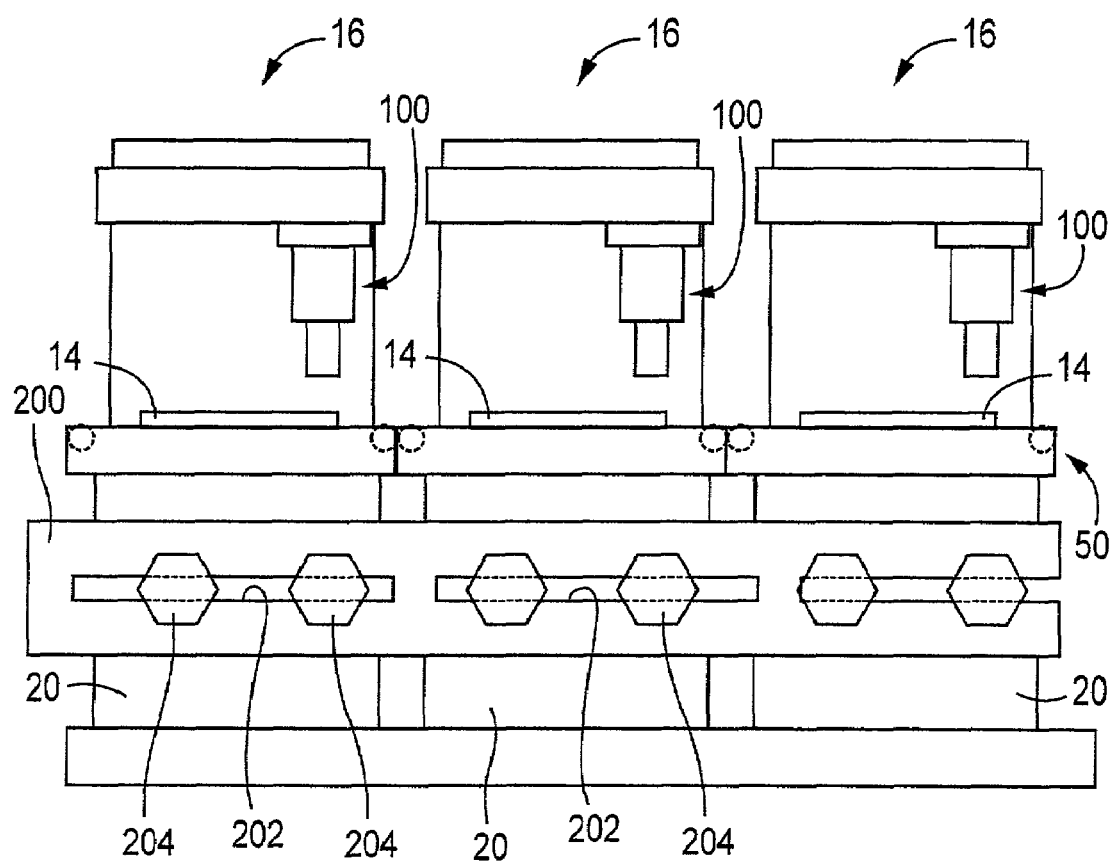
FIG. 7 is a view of an electric-component mounting system constructed according to another embodiment of the invention, as seen in the direction perpendicular to the above-described arrangement direction.
Figure 8:
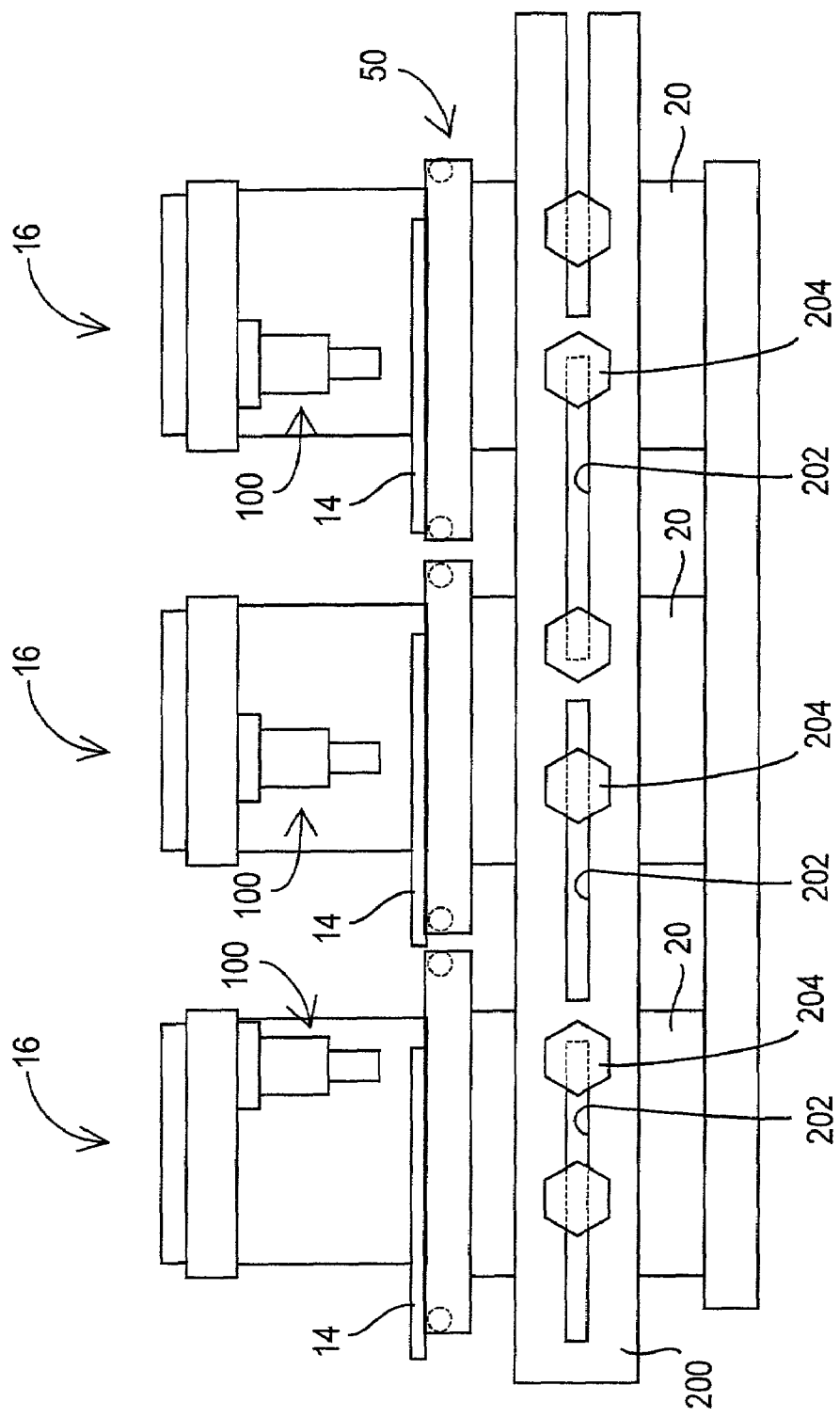
FIG. 8 is a view of the system of FIG. 7, showing a state in which the spacing distance between each adjacent pair of the mounting units is changed.

FIG. 7 illustrates an electric-component mounting system constructed according to another embodiment of the invention, in which a fixing member 200 is used to be fixed to all the mounting units 16 of the system. The fixing member 200 is provided by an elongated plate member, which has a length substantially equal to that of the entirety of the system and which has a plurality of elongated holes 202 each having a predetermined length as measured in the longitudinal direction of the fixing member 200. The elongated holes 202 are formed through the fixing member 200 in the thickness direction of the fixing member 200, and arranged in the longitudinal direction of the fixing member 200 at a predetermined pitch that is different from the width of each mounting unit 16. Two internally threaded holes are formed in a side surface of the bed 20 of each mounting unit 16, such that the two internally threaded holes extend perpendicularly to the side surface and are spaced apart from each other in the horizontal direction. Bolts 204 are introduced through the elongated holes 202 of the fixing member 200, and are then screwed into the respective internally threaded holes, whereby all the mounting unit 16 of the system are fixed to the fixing member 200. The sizes and pitch of the elongated holes 202 are arranged in such a manner that permits all the bolts 204 to pass through the respective elongated holes 202 irrespective of the amount of a desired pitch P1 at which the mounting units 16 are arranged. Namely, irrespective of the amount of the desired pitch P1, all the bolts 204 can be pass through the respective elongated holes 202 of the fixing member 200 to be screwed into the respective internally threaded holes formed in the side surfaces of the beds 20 on which the fixing member 200 is mounted, by adjusting the position of the fixing member 200 relative to the mounting units 16 in the arrangement direction in which the mounting units 16 are arranged. It is noted that the length of the fixing member 200 is preferably larger than that of the entirety of the system, for making it possible to change the spacing distance between each adjacent pair of the mounting units 16 without having to replacing the fixing member 200 with other fixing member 200.

In the electric-component mounting system constructed according to this embodiment of the invention, like in the system of the above-described embodiment of the invention, the board conveyor 50 of the board transferring and holding device 22 is provided in each of the mounting units 16. Although a dimension of the board conveyor 50 as measured in the above-described transferring direction is fixed, it is possible to change the spacing distance between each adjacent pair of the mounting units 16, by preparing a plurality of sets of board conveyors 50 which have different sizes and which are replaceable with each other. Further, the PC board 14 is transferable between the board conveyors 50 of the respective adjacent mounting units 16 even in the presence of a gap therebetween, as long as this gap is held smaller than a certain amount. Therefore, the spacing distance is infinitely variable, namely, finely adjustable. In this instance, the above-described certain amount, i.e., the permissible maximum amount of the gap is determined depending upon the dimension of the PC board 14 as measured in the transferring direction. It is considered that there is substantially not risk of dropping of the PC board 14 through the gap as long as the PC board 14 is supported at at least a major portion of its supported surface by one of the board conveyors 50. However, it should be noted that a considerable projection of the PC board 14 from an end of the board conveyor 50 tends to lead to an unstable supporting of the PC board 14 by the board conveyor 50, and even also to a risk of failure in the transfer of the PC board 14 because the projecting portion of the PC board 14 is likely to be elastically deformed in the downward direction.

Figure 9:
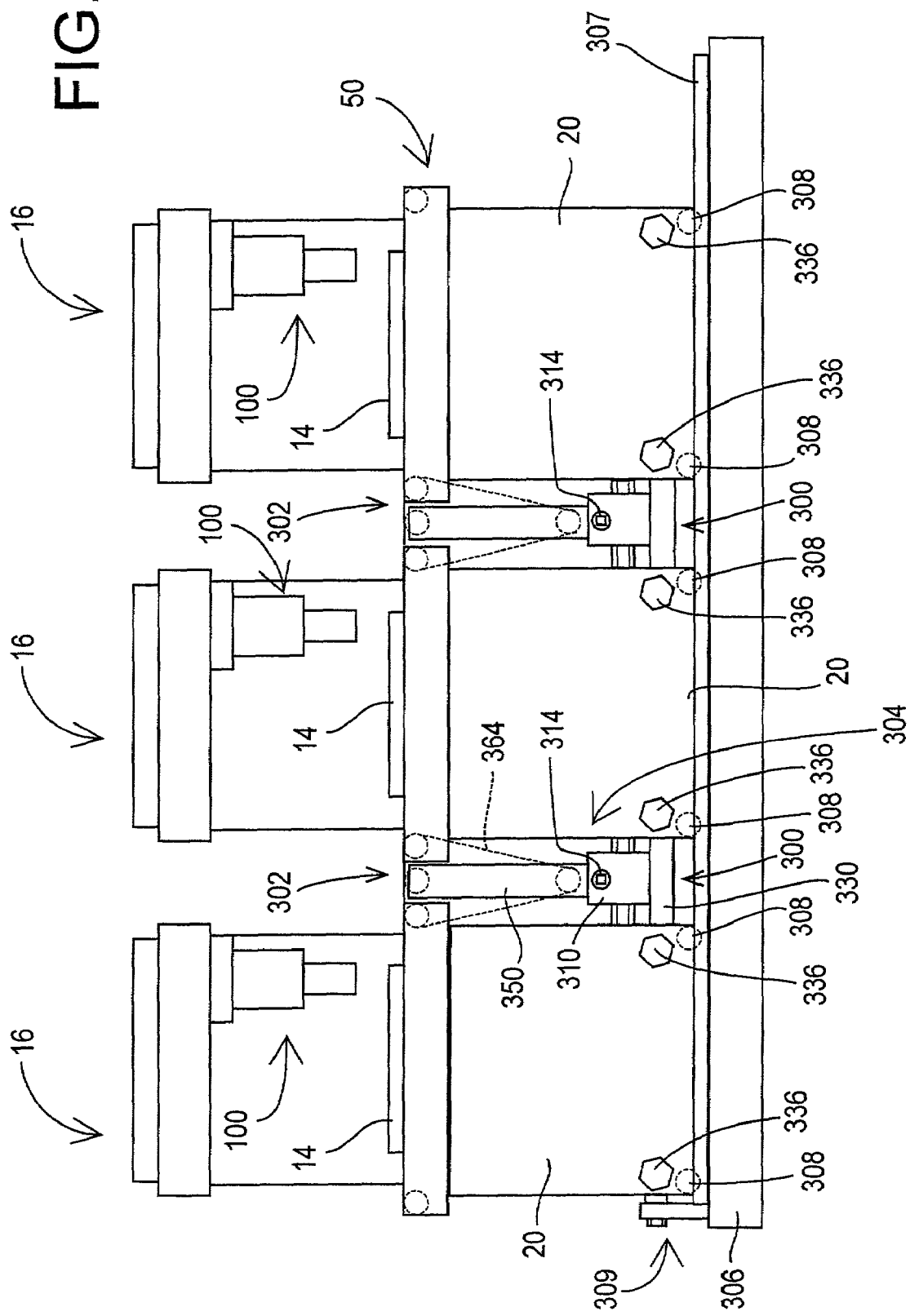
FIG. 9 is a view of an electric-component mounting system constructed according to still another embodiment of the invention, as seen in the direction perpendicular to the above-described arrangement direction.

FIG. 9 illustrates an electric-component mounting system constructed according to still another embodiment of the invention, which is equipped with a spacing-distance changing device 304 including a moving device 300 and an adjustable conveyor 302. The moving device 300 serves to move each adjacent pair of the electric-mounting units 16 toward and away from each other. The adjustable conveyor 302 serves to transfer the PC board 14 between each adjacent pair of the electric-component mounting units 16 through a transferring distance which is adjustable or changeable, for example, in view of the size of the PC board 14.

This system of FIG. 9 has a base 306, and a pair of guide rails 307 which are disposed on the base 306 so as to extend in parallel with each other in the X-axis direction. The bed 20 of each mounting unit 16 is provided with at least three wheels 308, which are guided by the pair of guide rails 307 such that the wheels 308 are movable in the X-axis direction and unmovable in the Y-axis direction relative to the base 306. In the example illustrated in FIG. 9 in which the wheels 308 consists of four wheels 308, two rotary shafts are provided in respective two portions of a lower end portion of the bed 20 of each mounting unit 16, which two portions are spaced apart from each other in the X-axis direction. Two wheels 308 is fixed to respective opposite end portions of each of the two rotary shafts, such that the two wheels 308 is rotatable about an axis of the rotary shaft extending in the Y-axis direction. The guide rails 307 has a length large enough for covering a length of the entirety of the system when a pitch between each adjacent pairs of the mounting units 16 is maximized. The maximum pitch between the adjacent mounting units 16 may be determined on the basis of a maximum amount of the spacing distance which can be provided by the spacing-distance changing device 304. However, it is preferable to determine this maximum pitch in view of a largest one of the PC boards 14 which are supposed to be manufactured by the system, for avoiding a considerable extension of the guide rails 307 which would be useless in the actual manufacturing of the PC boards 14.

A fixing device 309 is provided in at least one longitudinal end portion of the base 306, e.g., in an upstream end portion of the base 306 as viewed in the above-described transferring direction, for inhibiting the movement of the bed 20 of each mounting unit 16. In the example illustrated in FIG. 9, the fixing device 309 is provided by a bolt which extends in the X-axis direction, such that the base 306 and the bed 20 are fixed at their respective portions relative to each other through the bolt. It is preferable that a plurality of the fixing devices 309 are disposed in respective positions which are spaced apart from other in the Y-axis direction.

Figure 10:
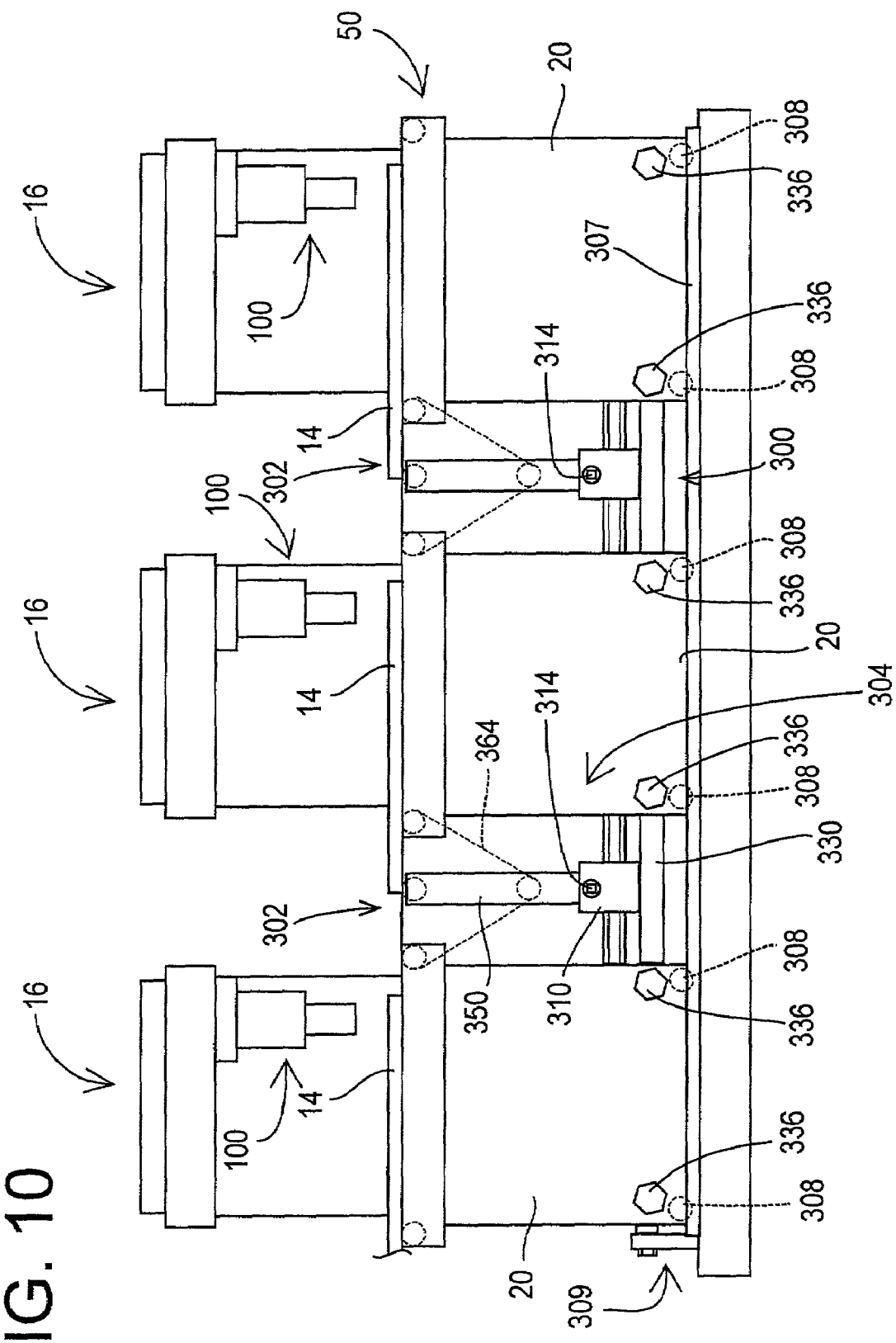
FIG. 10 is a view of the system of FIG. 9, showing a state in which the spacing distance between each adjacent pair of the mounting units is changed by a spacing-distance changing device of the system.
Figure 11:
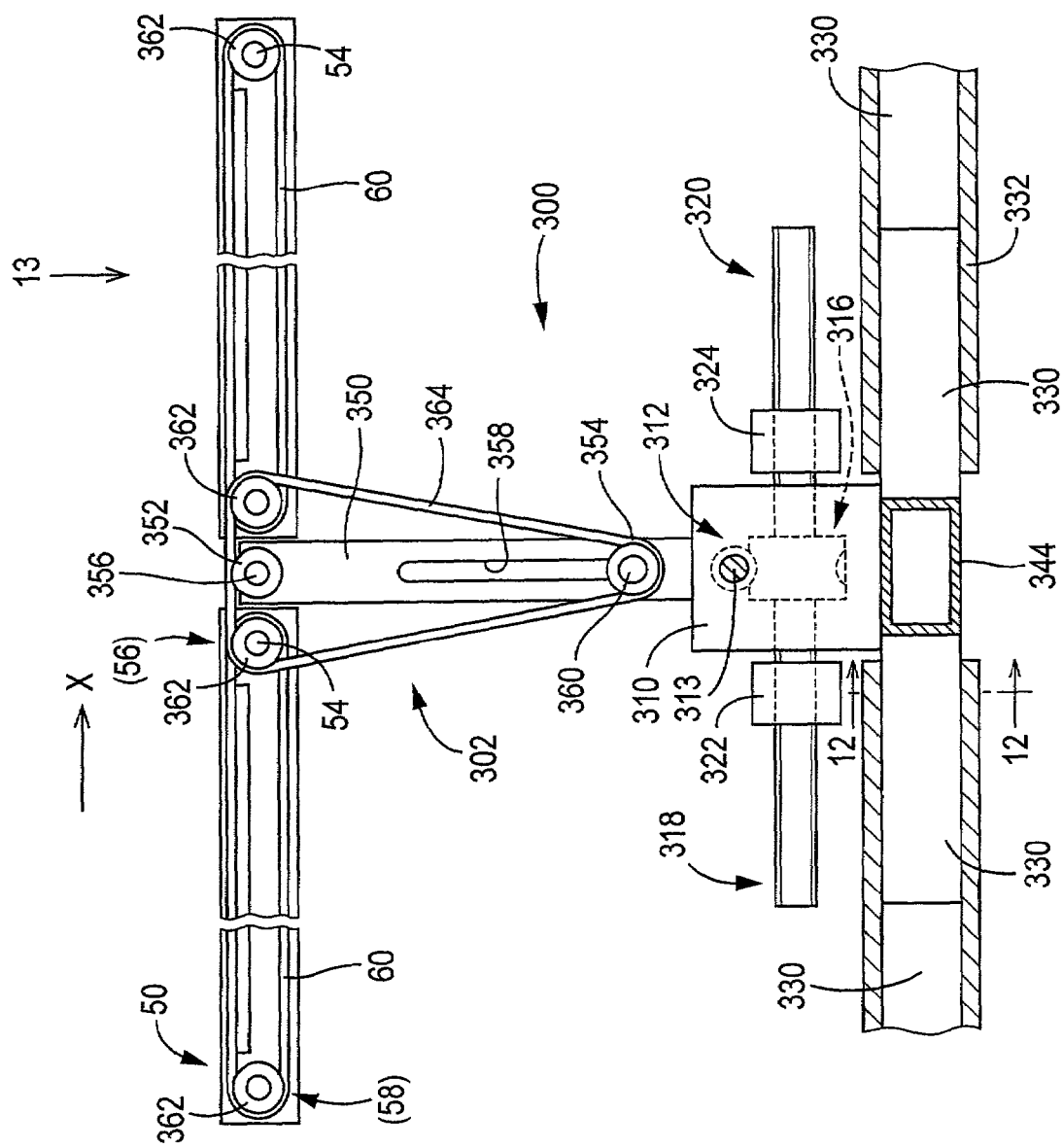
FIG. 11 is an enlarged view partially in cross section of the spacing-distance changing device of the system of FIGS. 9 and 10.

The moving device 300 includes a pair of housings 310 which are disposed on respective positions spaced apart from each other in the Y-axis direction, as shown in FIG. 11. In each of the housings 310, a worm 312 is provided to be rotatable about its axis parallel with the Y-axis direction. The worm 312 is held in each housing 310, rotatably about its axis and unmovably in its axial direction. The worms 312 provided in the respective housing 310 are connected to each other by a rotary shaft 313 which extends below the board conveyor 50 in the Y-axis direction. The rotary shaft 313 is held such that one of opposite end portions of the rotary shaft 313 projects outwardly of the housing 310. An engageable portion 314 is provided in an end face of the projecting end portion, as shown in FIGS. 9 or 10, so that the rotary shaft 313 and the worms 312 can be manually rotated by an operator with a suitable tool (not shown) which is engageable with the engageable portion 314. It is noted that the engageable portion 314 may includes a protrusion or recess having a non-circular cross sectional shape (e.g., a rectangular or other polygonal shape).

In each of the housings 310, a worm wheel 316 is provided to be rotatable about is its axis parallel with the X-axis direction. The worm wheel 316 is held in each housing 310, rotatably about its axis and unmovably in its axial direction, i.e., in the X-axis direction. The worm wheels 316 are adapted to mesh with the respective the worms 312, whereby the worm wheels 316 are rotatable in synchronization of the rotation of the worms 312. A left-hand screw 318 and a right-hand screw 320 extend coaxially with each other from respective axially opposite end faces of the worm wheel 316 in the X-axis direction. Each of the left-hand and right-hand screws 318, 320 has a length large enough to adjust or change the spacing interval between each adjacent pair of the mounting units 16. Described more specifically, each of the screws 318, 320 has such a length that permits a distal end of each of the screws 318, 320 to be positioned in an central portion of the bed 20 (which is not illustrated in FIG. 11 for easier understanding of the present moving device 300) when the spacing distance between the mounting units 16 is minimized. The screws 318, 320 are accommodated in spaces formed in the beds 20 of the adjacent mounting units 16, without interference of the screws 318, 320 with the beds 20. In the example of FIG. 11, the screw 318 is engaged with a nut 322 which is fixed to a forward end portion of the bed 20 of a rear side one of the adjacent mounting units 16 (as viewed in the above-described transferring direction), while the screw 320 is engaged with a nut 324 which is fixed to a rear end portion of the bed 20 of a forward side one of the adjacent mounting units 16. In this arrangement, a rotary motion applied to the rotary shaft 313 is converted into a lineal motion of the bed 20 of each mounting unit 16 in the X-axis direction. It is noted that the left-hand and right-hand screws 318, 320 have the same pitch, so that the adjacent mounting units 16 are moved toward or away from each other by the same distance when the worm 312 is rotated.

Figure 12:
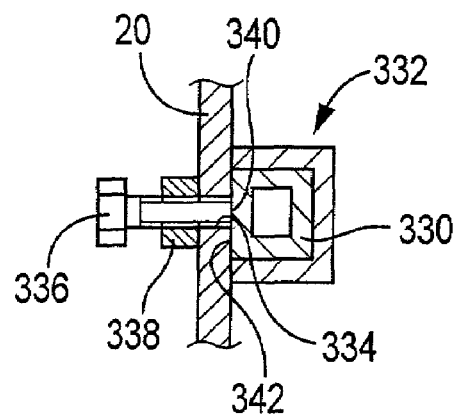
FIG. 12 is a cross-sectional view taken along line 12—12 of FIG. 11.

Below the left-hand and right-hand screws 318, 320, there is provided a guide bar 330 which extends in the X-axis direction. The guide bar 330 has its longitudinally opposite end portions which extend away from respective opposite end surfaces of the housing 310 in respective opposite directions. Each of the longitudinally opposite end portions of the guide bar 330 has substantially the same length as the corresponding one of the screws 318, 320, and is provided by an elongated hollow member having a rectangular cross section as shown in FIG. 12. The guide bar 330 is slidably fitted at the longitudinally opposite end portions in respective guide tubes 332 which are fixed to the beds 20 of the respective adjacent mounting units 16. Each of the guide tube 332 is provided by an elongated member having an U-shaped cross section, and is fixed to an inner surface of a wall of the bed 20 by a welding or other fixing means so that the a side wall 342 of the guide bar 330 is guided by the inner surface of the wall of the bed 20. Each guide tube 332 has a length equal to the width of the bed 20, i.e., a dimension of the bed 20 as measured in the X-axis direction, and is fitted at its respective longitudinally opposite end portions on the guide bars 330 which are introduced into the guide tube 332 through respective opening ends of the guide tube 332. Internally threaded holes 334 are formed through the wall of the bed 20 such that the internally threaded holes 334 are located in respective opposite end portions of the bed 20 as viewed in the X-axis direction. Each of the threaded holes 334 is open in the inner surface of the wall of the bed 20 by which the side wall 342 of the guide bar 330 is guided. A bolt 336 is screwed into each of the threaded holes 334, so that a distal end face 340 of the bolt 336 is forced onto the side wall 342 of the guide bar 330, whereby the guide bar 330 is forced onto the guide tube 332. The movement of the guide bar 330 relative to the guide tube 332 is thus inhibited, whereby the movement of the corresponding mounting unit 16 relative to the adjacent mounting unit 16 is inhibited. The bolt 336 is prevented from being unscrewed from the threaded hole 334, by a locknut 338 which is screwed onto the bolt 336 firmly against the outer surface of the wall of the bed 20 and which is loosened when the spacing distance is adjusted or changed. It is noted that each pair of the guide bars 330, which are disposed on respective positions spaced apart from each other in the Y-axis direction, are connected at their respective longitudinally intermediate portions to each other via a connecting member 344 which extends in the Y-axis direction.

Figure 13:
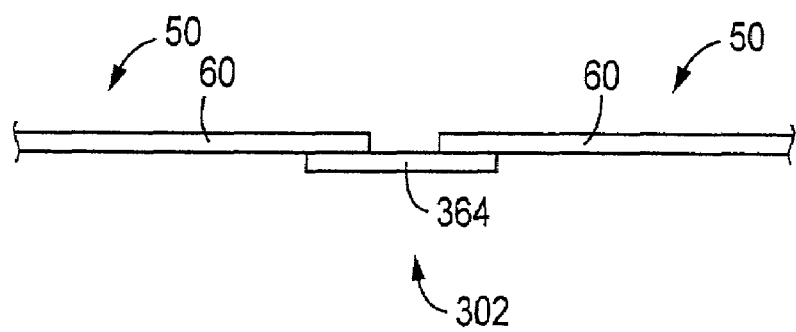
FIG. 13 is a view as seen in a direction indicated by arrow 13.

As shown in FIG. 11, a pair of struts 350 are provided to extend upwardly from upper faces of the respective housings 310 which are disposed on respective positions spaced apart from each other in the Y-axis direction. The struts 350 are positioned in the same positions of the pair of endless conveyor belts 60 of the board conveyor 50, as viewed in the Y-axis direction. A fixed pulley 352 and a tension pulley 354 are rotatably provided on each of inside surfaces of the respective struts 350 which are opposed to each other. Each of the struts 350 has a shaft 356 extending horizontally from its upper end portion. The shaft 356 is aligned with the above-described shaft 54 of the board conveyor 50 in the height direction, and receives the fixed pulley 352 having the same diameter of the above-described driving pulley 56. Each strut 350 has an elongated hole 358 extending from its lower portion toward its upper portion. The tension pulley 354 is rotatably mounted on one of opposite end portions of a displaceable shaft 360 which is slidably engaged in the elongated hole 358. The displaceable shaft 360 has a threaded portion (not shown) formed in the other of the opposite end portions, so that the displaceable shaft 360 is fixed to the strut 350, by screwing a fastening nut (not shown) onto the threaded portion firmly against the strut 350. A connecting pulley 362 is mounted on each of the shafts 54, so as to be rotatable together with the above-described driving pulley 56 or driven pulley 58. The fixed pulley 352, the tension pulley 354 and the connecting pulley 362 are aligned with each together, and are located inwardly of the driving and driven pulleys 56, 58 as viewed in the Y-axis direction. An endless conveyor belt 364 is wound on the fixed pulley 352, the tension pulley 354 and two adjacent connecting pulleys 362, so that the gap between the board conveyors 50 of the respective adjacent mounting units 16 is filled with the conveyor belt 364, as shown in FIG. 13. The conveyor belt 364 of the adjustable conveyor 302 are positioned inside of the conveyor belt 60 of the board conveyor 50 as viewed in the Y-axis direction, such that the conveyor belt 364 and the conveyor belt 60 do not interfere with each other. Since one of the two adjacent connecting pulleys 362 is driven together with the driving pulley 56 by the driving power source, the conveyor belt 364 of the adjustable conveyor 302 are circulated in synchronization with the circulation of the conveyor belt 60 of the board conveyor 50.

When the spacing distance between each adjacent pair of the component mounting units 16 require to be changed, the bolt 336 is loosened for allowing movement of the guide bar 330 relative to the bed 20, while the above-described fastening nut is loosened for allowing movement of the displaceable shaft 360 of the tension pulley 354 relative to the strut 350, so that the adjacent pair of mounting units 16 which are located on the opposite side of the spacing-distance changing device 304 are movable toward and away from each other in response to the rotation of the worm 312 which is manually made by the operator. In this instance, the other spacing-distance changing devices 304 of the system are not activated so that the other pairs of mounting units 16 are unmovable relative to each other. Therefore, when the spacing distance between one of the pairs of mounting units 16 is changed by the activation of the corresponding one of the spacing-distance changing devices 304, the mounting units 16 located on each of opposite sides of the corresponding spacing-distance changing device 304 are moved together with each other. In the system of the present embodiment of the invention, such a movement of the mounting units 16 together with each other is facilitated by the guide rails 307 and the wheels 308 which are provided on the base 306 and the bed 20 of each mounting unit 16, respectively.

When the adjacent board conveyors 50 are moved away from each other as a result of increase in the spacing distance, the conveyor belt 364 is tensed by the adjacent connecting pulleys 362 which are also moved away from each other, whereby the tension pulley 354 is pulled upwardly by the tensed belt 364. When the adjacent board conveyors 50 are moved toward each other as a result of reduction in the spacing distance, the conveyor belt 364 is loosened whereby the tension pulley 354 is allowed to be displaced downwardly. After the spacing distance between the adjacent mounting units 16 has been changed to a new spacing distance, the bolt 336 is tighten for inhibiting movement of the adjacent mounting units 16 relative to each other. The tension pulley 354 is positioned relative to the strut 350 in a such a position that provide the conveyor belt 364 with a suitable degree of tension, and is then fixed to the strut 350. These operations are carried out in each of the spacing-distance changing devices 304, so that the spacing distance between each adjacent pair of the mounting units 16 of the system is changed.

In the system of the present embodiment of the invention, the spacing distance is infinitely variable. Further, the provision of the wheels 308 in the bed 20 of each mounting unit 16 facilitates the movement of each mounting unit 16 and the change of the spacing distance, and is accordingly effective, particularly, where the change of the spacing distance is required very frequently as a routine work, or where the number of the mounting units 16 constituting the system is very large. Further, even where the gap between the board conveyor 50 of each adjacent pair of the mounting units 16 is large, the PC board 14 is supported by the adjustable conveyor 302 whereby the PC board 14 can be reliably transferred between the adjacent mounting units 16. Further, the fixed pulley 352 serves to support an intermediate portion of a part of the conveyor belt 364 which part extends horizontally between the adjacent connecting pulleys 362, thereby preventing the intermediate portion of the horizontally extending part of the conveyor belt 364, from being displaced downwardly. It is noted that guiding surfaces are preferably provided in the respective struts 350 such that the guide surfaces are aligned with the above-described inside surfaces of the respective side frames 52 of the board conveyor 50 as viewed in the Y-axis direction, so that the PC board 14 is guided at its opposite end surfaces by the guiding surfaces while being transferred by the adjustable conveyor 302.

While the moving device 300 of the spacing-distance changing device 304 is manually operated in this embodiment, the moving device 300 may be also operated by a driving power source. In this case, the spacing device can be controlled more accurately, for example, by detecting an angle of rotation of the worm 312 or the worm wheel 316.

In the illustrated embodiments described above, the side frames 52 of the board conveyor 50 are spaced apart from each other in the Y-axis direction by a fixed distance. However, at least one of the side frames 52 may be adapted to be movable toward and away from the other side frame 52, so that the width of the board conveyor 50 is changeable depending upon the size of the PC board 14. In this case, at least one of the pair of struts 350, which are spaced apart from each other in the Y-axis direction, may be adapted to be movable toward and away from each other. Alternatively, the fixed and tension pulleys 352, 354 may be adapted to be movable in the Y-axis direction without moving the strut or struts 350.

While the presently preferred embodiments of this invention have been described above in detail by reference to the accompanying drawings, for illustrative purpose only, it is to be further understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. An electric-component mounting system for mounting a plurality of electric components onto a circuit board, said system comprising:

a plurality of electric-component mounting units which are arranged in a predetermined direction with a spacing distance between each adjacent pair of said electric-component mounting units, wherein each of said electric-component mounting units includes (a) a board holding device which is capable of holding the circuit board in a predetermined position, (b) a component mounting device which is capable of mounting the electric components onto the circuit board held by said board holding device, and (c) a component supplying device which is capable of supplying the electric components to said component mounting device, said system further comprising:

a spacing-distance changing device capable of changing said spacing distance between each adjacent pair of said electric-component mounting units.

2. The electric-component mounting system according to claim 1, wherein each of said electric-component mounting units further includes a main body on which said board holding device, said component mounting device and said component supplying device are disposed, and wherein said spacing-distance changing device includes a spacer which is to be interposed between the main bodies of each adjacent pair of said electric-component mounting units.

3. The electric-component mounting system according to claim 1, wherein each of said electric-component mounting units further includes a main body on which said board holding device, said component mounting device and said component supplying device are disposed, and wherein said spacing-distance changing device includes a connecting device which connects the main bodies of each adjacent pair of said electric-component mounting units and which is capable of changing said spacing distance such that said spacing distance is infinitely variable.

4. The electric-component mounting system according to claim 1, wherein each of said electric-component mounting units further includes a main body on which said board holding device, said component mounting device and said component supplying device are disposed, and wherein said spacing-distance changing device includes a connecting device which connects the main bodies of each adjacent pair of said electric-component mounting units and which includes a moving device capable of moving said main bodies of each adjacent pair of said electric-component mounting units toward and away from each other.

5. The electric-component mounting system according to claim 1, wherein each of said electric-component mounting units further includes a main body on which said board holding device, said component mounting device and said component supplying device are disposed,
and wherein said spacing-distance changing device includes a fixing device which is capable of fixing the main bodies of each adjacent pair of said electric-component mounting units relative to each other, such that said main bodies are unmovable relative to each other after said spacing distance is changed.

6. The electric-component mounting system according to claim 1, further comprising a board transferring device which is capable of transferring the circuit board between said electric-component mounting units.

7. The electric-component mounting system according to claim 6, wherein said board transferring device is provided by said board holding device of each of said electric-component mounting units.

8. The electric-component mounting system according to claim 6, wherein said board transferring device includes a conveyor which is capable of transferring the circuit board between each adjacent pair of said electric-component mounting units through a transferring distance in said predetermined direction in which said electric-component mounting units are arranged, and which is capable of changing said transferring distance.

9. The electric-component mounting system according to claim 6, comprising a second board transferring device in addition to said board transferring device as a first board transferring device,
wherein said first board transferring device is capable of transferring the circuit board through a first transferring distance,
wherein said second board transferring device is capable of transferring the circuit board through a second transferring distance which is different from said first transferring distance,
and wherein the circuit board is transferable between said electric-component mounting units, by a selected one of said first and second board transferring devices.

10. The electric-component mounting system according to claim 6, wherein said board transferring device includes a conveyor which is capable of transferring the circuit board between each adjacent pair of said electric-component mounting units in said predetermined direction in which said electric-component mounting units are arranged,
and wherein said conveyor includes a pair of belts which are spaced apart from each other in a direction perpendicular to said predetermined direction, so that the circuit board is transferred while being supported, at portions of a surface thereof which are distant from each other, by said pair of belts.

11. The electric-component mounting system according to claim 6, wherein said component supplying device of each of said electric-component mounting units is disposed on at least one of opposite sides of said board transferring device in a direction perpendicular to said predetermined direction as seen in a plan view of said system,
and wherein said component supplying device includes a plurality of component supplying portions through which said component supplying device is capable of supplying respective different sorts of components as said electric components, to said component mounting device.

12. The electric-component mounting system according to claim 1, wherein each of said plurality of electric-component mounting units includes at least three wheels each rotatable about an axis thereof which is perpendicular to said predetermined direction in which said electric-component mounting units are arranged.

13. The electric-component mounting system according to claim 1, wherein said component supplying device of each of said electric-component mounting units includes a plurality of component supplying portions through which said component supplying device is capable of supplying respective different sorts of components as said electric components, to said component mounting device,
and wherein said plurality of component supplying portions are arranged in said predetermined direction in which said electric-component mounting units are arranged.

14. The electric-component mounting system according to claim 1, wherein said component mounting device of each of said electric-component mounting units includes:
a mounting head which is capable of mounting the electric components at respective positions on the circuit board held by said board holding device; and
a mounting-head moving device which is capable of moving said mounting head relative to said board holding device in at least one of said predetermined direction and a direction perpendicular to said predetermined direction.

15. The electric-component mounting system according to claim 1,
wherein each of said electric-component mounting units further includes a main body on which said board holding device, said component mounting device and said component supplying device are disposed,
and wherein said spacing-distance changing device includes a moving device capable of moving said main bodies of each adjacent pair of said electric-component mounting units toward and away from each other.

16. The electric-component mounting system according to claim 15, wherein said spacing-distance changing device further includes a conveyor which is capable of transferring the circuit board between each adjacent pair of said electric-component mounting units through a transferring distance in said predetermined direction in which said electric-component mounting units are arranged, and which is capable of changing said transferring distance in synchronization with movements of said main bodies which are made by said moving device.

17. The electric-component mounting system according to claim 16,
wherein said conveyor has an endless belt which is wound on at least three pulleys including a first pulley which is disposed at a downstream end of an upstream side one of each adjacent pair of said electric-component mounting units as viewed in said predetermined direction, a second pulley which is disposed at an upstream end of a downstream side of one of each adjacent pair of said electric-component mounting units as viewed in said predetermined direction, so as to cooperate with said first pulley to define said transferring distance, and a third pulley which serves as a tension pulley,
and wherein said third pulley is movable when said main bodies are moved by said moving device, so as to allow change of a distance between said first and second pulleys, for thereby permitting said transferring distance defined by said first and second pulleys to be changed in synchronization with the movements of said main bodies.

18. The electric-component mounting system according to claim 15,
wherein said moving device includes: (i) a shaft member rotatable about an axis thereof that extends in said predetermined direction, and having a left-hand threaded portion and a right-hand threaded portion at respective axially opposite end portions thereof; (ii) a first internally threaded member engaged with said left-hand threaded portion; and (iii) a second internally threaded member engaged with said right-hand threaded portion,
and wherein said first and second internally threaded members are fixed to the respective main bodies of each adjacent pair of said electric-component mounting units, whereby said main bodies are movable toward and away from each other in response to rotation of said rotatable shaft member.

\* \* \* \* \*